United States Patent [19]

Robinson et al.

[11] 4,270,183
[45] May 26, 1981

[54] DATA DEJITTERING APPARATUS

[75] Inventors: Robert L. Robinson, West Covina; David C. Hoff, Temple City; Robert L. Midling, Azusa, all of Calif.

[73] Assignee: Lockheed Aircraft Corp., Plainfield, N.J.

[21] Appl. No.: 767,807

[22] Filed: Feb. 11, 1977

[51] Int. Cl.³ .............................................. G06F 11/00
[52] U.S. Cl. ........................................ 364/900; 360/51
[58] Field of Search .................... 360/36, 26, 51; 364/900 MS File; 235/92 DP; 179/15.55 T

[56] References Cited

U.S. PATENT DOCUMENTS

| 3,639,689 | 2/1972 | Doi | 360/36 |
|---|---|---|---|
| 3,676,583 | 7/1972 | Morita et al. | 360/36 |
| 3,789,379 | 1/1974 | Breikss | 360/51 |
| 3,795,872 | 3/1974 | Napolitano et al. | 331/49 |
| 3,831,189 | 8/1974 | Shenk et al. | 360/26 |
| 3,851,335 | 11/1974 | Elliott | 360/26 |
| 3,909,843 | 9/1975 | Wray | 360/27 |
| 3,959,815 | 5/1976 | Rotter et al. | 360/36 |
| 3,978,519 | 8/1976 | Stalley et al. | 360/36 |
| 4,040,027 | 8/1977 | van Es et al. | 364/900 |
| 4,054,921 | 10/1977 | Tatami | 360/36 |

Primary Examiner—Joseph M. Thesz
Attorney, Agent, or Firm—Jackson, Jones & Price

[57] ABSTRACT

A circuit for dejittering transmitted digital data. A buffer stores the incoming data and has its half-full condition monitored by content decoding circuitry including a counter whose count is converted to control the frequency of a voltage controlled oscillator. The oscillator clocks the data out of the buffer effectively free of harmful jitter.

15 Claims, 8 Drawing Figures

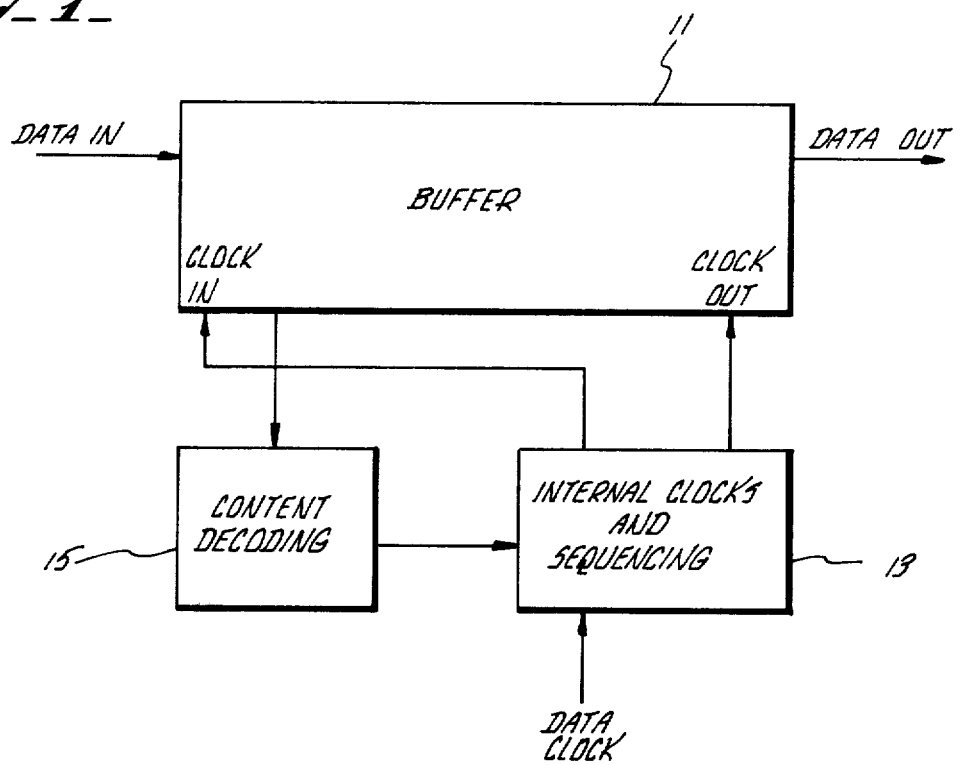
FIG_1_
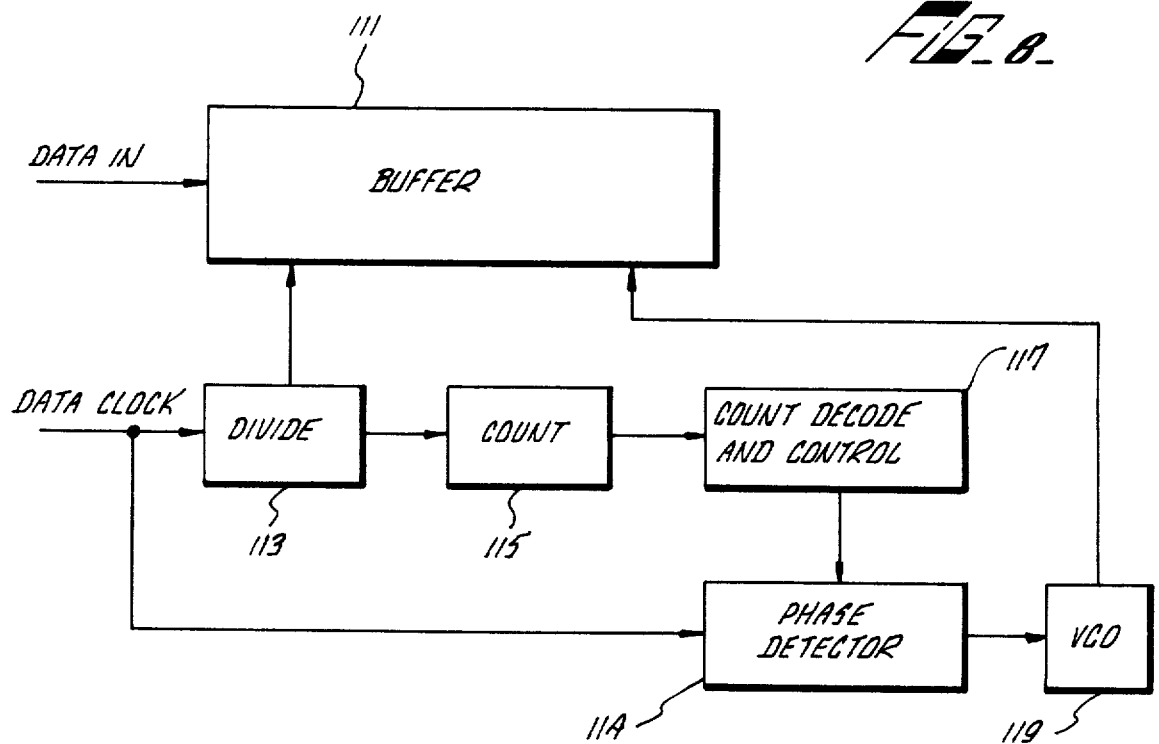
FIG_8_

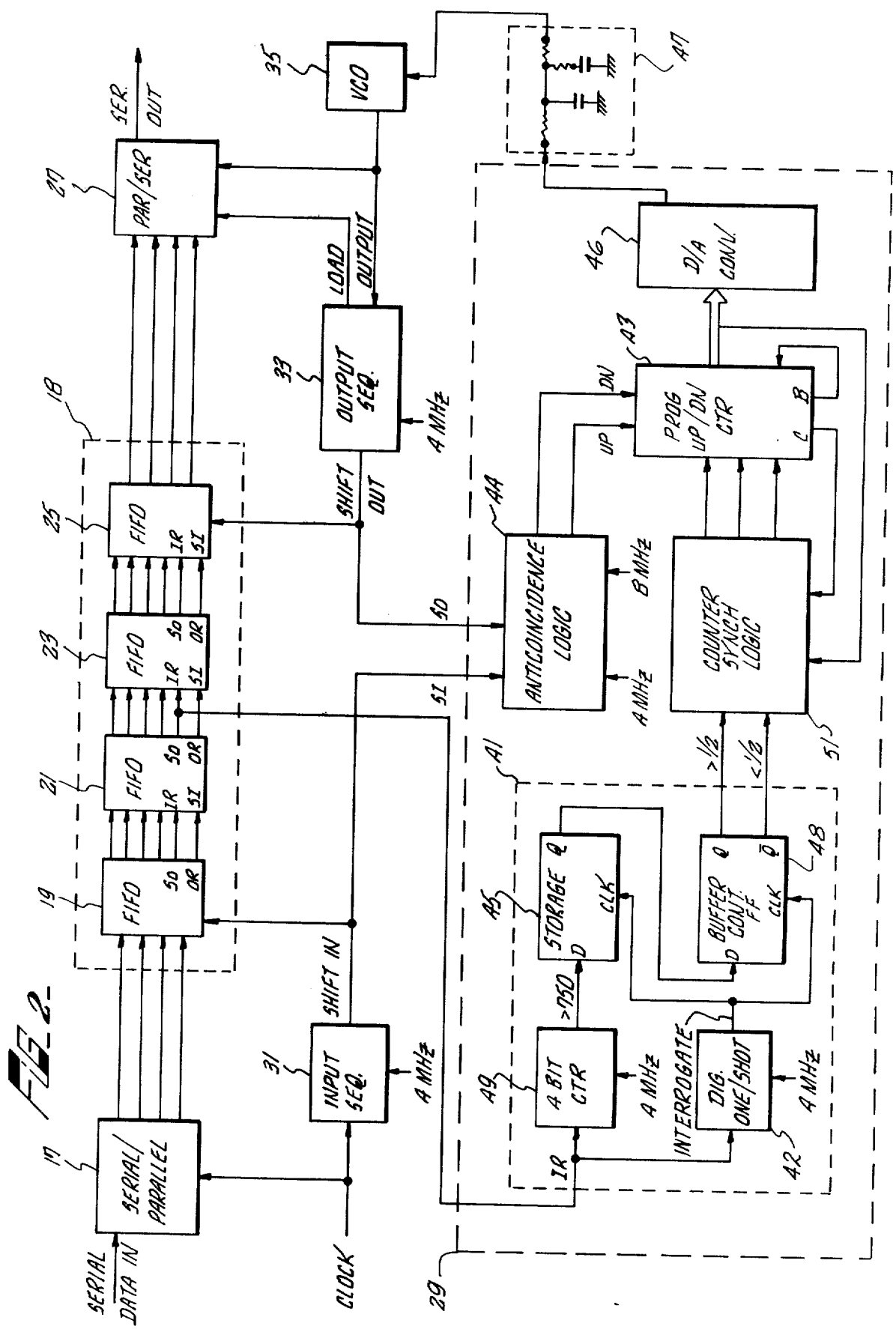

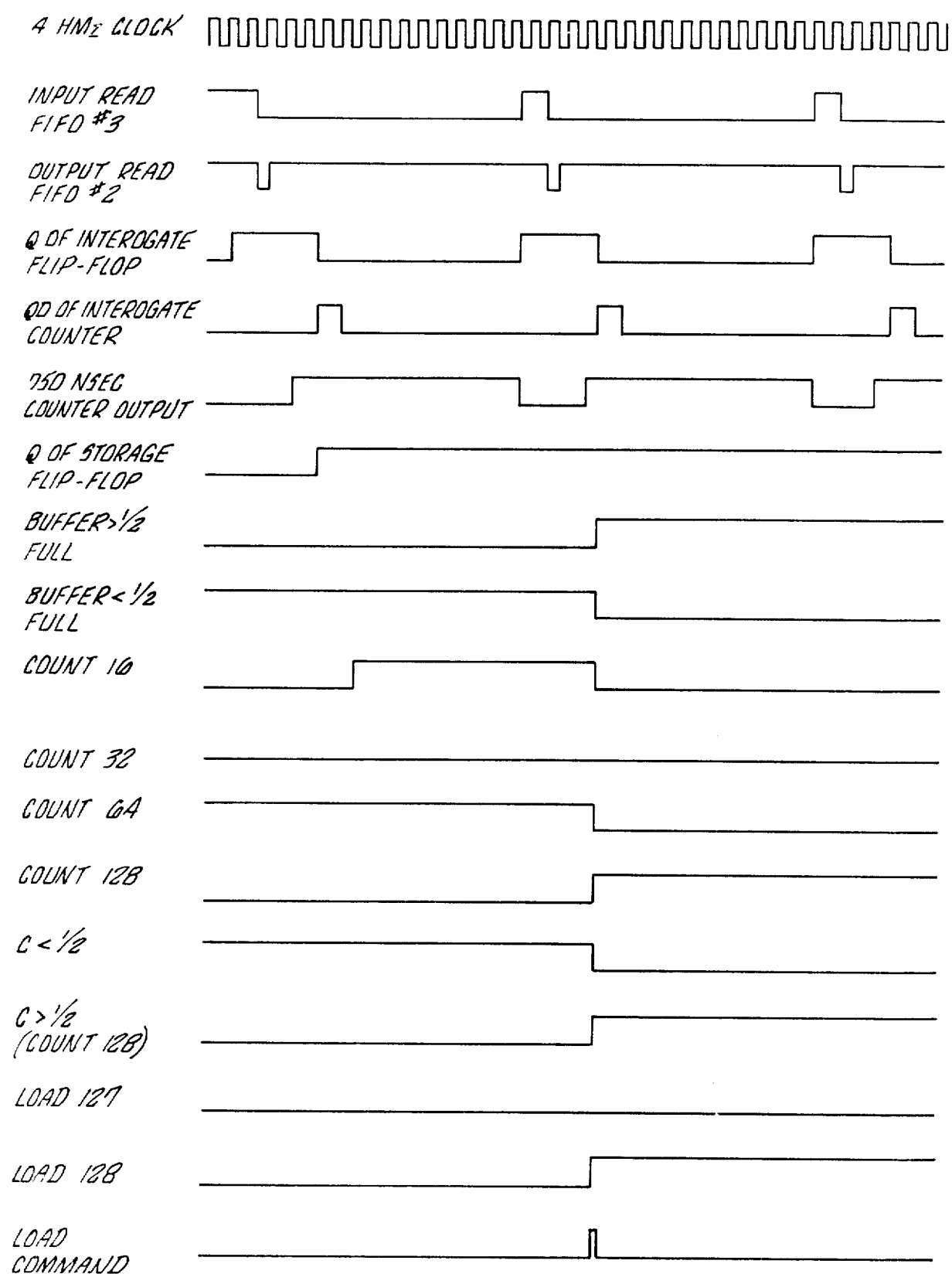
FIG_6

DATA DEJITTERING APPARATUS

BACKGROUND OF THE INVENTION

The subject invention relates to the dejittering of signals transmitted between a source and a receiving apparatus, and more particularly to the dejittering of data in a digital or digitally encoded format.

In transmitting digital data between a source and a receiving apparatus it is common for frequency distortion known as jitter and flutter to be introduced in the data and data-derived clocks. For example, jitter may be introduced when multiple tape copies are made between successive tape recorders. Particularly in satellite transmissions from satellite born recording apparatus, the problem of high frequency jitter is compounded by the transmission of the signal through space. While processors receiving data containing such jitter are relatively insensitive to low frequency flutter, the higher the frequency, the less tolerant the processors are to it, and the more errors are likely to occur. In such applications, megacycle data may exhibit jitter at kilohertz frequencies. Low frequency flutter may be tolerated up to about 100 hertz.

Jitter correcting apparatus has been known in connection with magnetic recording and reproducing systems. U.S. Pat. No. 3,639,689, issued to Doi, Feb. 1, 1972, discusses various approaches to this problem. In general, such apparatus controls a variable delay circuit inserted in the path of the reproduced signal by comparing the reproduced video signal or alternatively its phase to a corresponding reference signal, or by developing a jitter control signal from phase comparison operations. These circuit techniques differ markedly from that of the subject invention, which pertains to dejittering transmitted data typically in an encoded digital format.

SUMMARY OF THE INVENTION

It is, therefore, an object of the invention to provide a means for dejittering digital data. It is another object of the invention to significantly reduce the performance requirements of information processing equipments located down link from a recorder or other apparatus used to transmit data. More particularly, an object of the invention is to facilitate the use of narrower bandwidth tracking filters in an RF transmission channel and the successive copying of tapes from one transport to another without cumulative jitter distortion.

These and other objects and advantages of the invention are accomplished as follows. A digital buffer is employed to store incoming data which contains jitter. An oscillator operating at a nominal input data rate is used to clock data out of the buffer. The buffer contents are monitored, and the frequency of the oscillator is adjusted in accordance with the buffer contents in order to compensate for the jitter present at the input.

BRIEF DESCRIPTION OF THE DRAWINGS

The preferred embodiment and best mode presently contemplated for implementing the just summarized invention will now be described in detail in conjunction with the drawings of which:

FIG. 1 illustrates a general block diagram of the preferred embodiment.

FIG. 2 illustrates a circuit schematic of an implementation of the preferred embodiment.

FIG. 6 and FIG. 7 illustrate waveforms in the buffer monitoring circuitry of FIG. 2.

FIG. 8 illustrates an alternate embodiment according to the invention.

FIG. 1 illustrates the preferred embodiment of the invention in general block form. The dejittering configuration includes a data buffer 11, timing and internal clock circuitry 13 and content decoding circuitry 15. The dejittering configuration receives jittering data and a data-derived clock, which jitters in synchronization with the data. The internal clock circuitry 13 receives the data clock and clocks data into the buffer 11. The contents of the buffer 11 are monitored by the content decoding circuitry 15 to adjust the rate at which the timing and internal clock circuitry 13 clocks data out of the buffer in order to produce output data free of undesirable jitter. This operation will be elaborated upon in the succeeding paragraphs, in connection with FIGS. 2 through 7.

As illustrated in FIG. 2, the preferred embodiment includes an input serial to parallel converter 17; a FIFO buffer 18 including four 4×64-bit FIFO storage registers 19, 21, 23, 25; an output parallel to serial converter 27; buffer content decoder circuitry 29; and associated timing circuitry including input and output sequencers 31, 33 and a voltage controlled oscillator 35. Considering the general operation of this circuitry, input data is clocked in parallel into the FIFO buffers 19, 21, 23, 25 from the serial parallel converter 17 by the input sequencer 31. The data may be in various formats, for example such as NRZ encoded. The buffer content is monitored by a "half-full" circuit 41 in the content decoding circuitry which taps a control input to one of the FIFO registers 23. An up/down counter 43 counts the number of bytes in the FIFO buffer 18 and is subject to correction by the half-full circuitry 41. A digital to analog converter 46 converts the counter output to an analog signal, which is filtered by a lag-lead-lag filter 47 to control the data output clock frequency generated by the voltage controlled oscillator (VCO) 35.

The amount of storage available in the buffer 18 is an important parameter in that it determines the frequency of jitter which can be compensated for, that is, the amount of variation and the frequency of variation about a desired reference frequency. The circuitry operates such that the average frequency of the input data is produced at the output of the buffer by the VCO. The longer one wants the VCO to average, the longer one has to be able to store incoming data. Maximum tolerance to frequency changes, that is instantaneous surges, is given by maintaining a half-full condition in the buffer 18. The jitter tolerance at the output determines how far from the one-half full point one can deviate.

Figure 3:
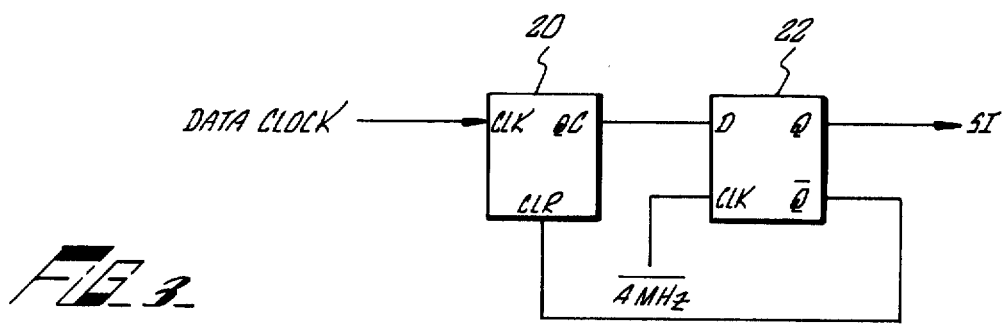
FIG. 3 illustrates an input sequencer employable in the preferred embodiment.

Examining the circuitry of FIG. 2 in more detail, the input data and data derived clock are presented to the serial to parallel converter 17 to convert the serial data stream into four-bit parallel bytes to match the structure of the FIFO registers 19, 21, 23, 25. The data derived clock is also divided by four and pulse-formed by the input sequencer 31 to perform the "shift-in" function for the FIFO buffer 18, so that as soon as a four bit byte has been accumulated in the serial to parallel converter 17 it will be shifted into the buffer 18. The sequencer 31 may be configured from a four-bit counter 20 connected to trigger a flip-flop 22 clocked by an internal synchronizing clock, as shown in FIG. 3.

The four FIFO registers 19, 21, 23, 25, which comprise the buffer 18, are connected in a cascade manner which causes a byte clocked into the first FIFO register 19 to ripple through to the output of the last FIFO register 25. This ripple-through is accomplished by connecting the Output Ready (OR) status output of one FIFO register to the Shift-In (SI) input of the next, and connecting the Input Ready (IR) status output to the preceding FIFO register's Shift-Out (SO) input. When a data byte moves into the output register on one FIFO, its OR status will go true. This forms a Shift-In (SI) command to the next FIFO. When the data has been accepted by the next FIFO, its IR status will go false, providing a Shift-Out (SO) command to the preceding FIFO register. This command SO clears the output stage of the preceding FIFO and moves the next data byte in line into that output stage, causing the OR status of the preceding FIFO to again go true. This procedure continues until either the preceding FIFO register is empty, at which point the OR status will remain false, or the succeeding FIFO register is full, which will cause the IR status to remain false. In this manner, data bytes ripple through the buffer into the output stage of the last FIFO register 25.

Figure 4:
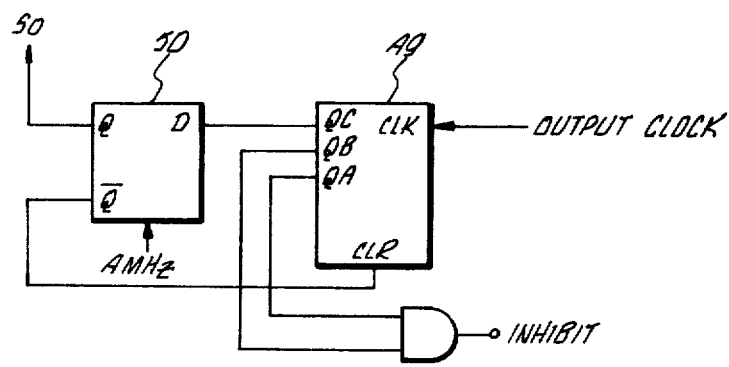
FIG. 4 illustrates an output sequencer employable in the preferred embodiment.

The output from the output stage of the last FIFO register 25 is applied to the parallel to serial converter 27 to return the data to a serial bit stream. The output clock from the VCO shifts the data out of the converter 27. This VCO clock is also applied to the output sequencer 33, which provides the timing sequence to load the parallel to serial converter 27 and to shift data out of the buffer 18. The sequencer 33 includes a counter 49 and a shift out SO flip-flop 50 as shown in FIG. 4.

The output sequencer 33 performs the following sequence. The falling edge of each of three VCO output clocks shifts the data serially to the QD output of the parallel to serial converter 27. On the next rising edge of the VCO output clock, the shift-out mode of the converter 27 is inhibited. On the next falling edge of the VCO clock, parallel data from the buffer is loaded into the converter 27. The next rising edge of the VCO clock removes the inhibit signal to the converter 27 and sets the QC (third bit) output of the counter 43. This high condition of the counter output QC will cause the SO flip-flop to set on the next pulse of the internal synchronizing clock, which is shown at an exemplary frequency of 4 MHz. The counter 49 will be reset when the SO flip-flop 51 is set. Therefore, the next 4 MHz clock will reset the SO flip-flop 51 creating a shift-out command to the buffer 18. The sequence then repeats.

In order to control the output clock of the VCO to effectively eliminate jitter, the buffer content decoder 29 monitors the storage status of the FIFO buffer 18. The buffer content decoder 29 uses the IR status of the third FIFO register 23 to determine whether the buffer is greater or less than one half-full. This information is used to be sure that the buffer content counter 43 is in synchronism with the actual buffer content. The basis of operation is that when the buffer 18 is greater than one half-full the third FIFO register 23 is full and when the buffer 18 is less than one half full third FIFO register 23 will not be full. Therefore, the condition of the buffer 18 is determined by the IR status line of the third FIFO register 23.

The half-full circuit 41 monitors the IR line, which provides the following indications. If a shift-in occurs for the third FIFO register 23 and it is not full, then IR will go false for a maximum period of time, for example 500 ns, and then return to the true state. If the third FIFO 23 is full, then IR will stay false until a byte is shifted out. By determining whether the IR line stays false for over the maximum period of time, the over half-full condition of the buffer 18 can be detected.

The half-full circuit 41 is implemented so that the condition for calling the buffer less than one-half full must occur twice in succession for it to be recognized. This constraint is required because, in the particular implementation, the less than one-half full condition can occur when the buffer is greater than half full due to the lack of synchronism between the internal ripple through timing of the FIFO registers 19, 21, 23, 25 and the shift-out clock SO. However, an erroneous condition cannot occur twice in succession.

The following is a description of the half-full circuitry 41, using 500 ns as an exemplary IR maximum false period when the third FIFO 23 is not full. A digital one shot 42, composed of a type D flip-flop and a four bit binary counter creates an interrogate pulse 1 to 1¼ micro seconds after the IR status output of the third FIFO 23 goes false. This interrogate pulse is used to clock a storage flip-flop 45 and a buffer content flip-flop 48. A second four bit counter 49 is started when IR goes false. This second counter 49 determines whether the IR status remains false for over 750 nanoseconds. If it does, then the second counter output will hold the D input to the storage flip-flop 45 high, and the interrogate pulse will set the Q output of the storage flip-flop 45 high. If the next sequence also has the IR status false for more than 750 nanoseconds, then the buffer content flip-flop 47 will be set to indicate that the buffer is greater than half-full. When set, two consecutive sequences showing IR false for less than 750 nanoseconds will be required before the buffer content flip-flop 47 will indicate that the buffer is less than half-full. The outputs of the buffer content flip-flop (Buffer>½ and Buffer<½) are presented to the counter synchronizing logic 51 for the up/down counter 43.

The up-down counter 43 is used to keep track of the content of the buffer 18 to the nearest byte. The counter 43 is composed of two cascaded four-bit, programmable, up/down counters, giving 8 bit resolution of the buffer content. The up-count clock is derived from the Shift-In command to the buffer 18, and the down count clock is derived from the Shift-Out command to the buffer 18.

To insure against simultaneous up and down counts to the counter 43, anticoincidence logic 44 may be employed. Since the Shift-In and Shift-Out commands to the first FIFO 19 and last FIFO 21 are synchronous to the internal clock (4 MHz) and are one clock wide, the Shift-In command is logically AND'ed with the 4 MHz clock and an 8 MHz clock to provide count-up, and the Shift-Out command is logically AND'ed with the inverse of the 4 MHz clock and the 8 MHz clock to provide count-down. With this logical operation, the up-count always occurs during the first half of the 4 MHz clock period.

The binary outputs of the counter 43 are then fed to converting and synchronizing circuitry. In order to prevent a "roll-over" when the buffer 18 is completely empty or full, the circuit may be implemented so that a carry output from the counter 43 forces a "load 255"

condition, while a borrow output clears the counter 43. The binary outputs of the counter 43 are presented to the digital to analog converter 46 for conversion to an analog voltage and are decoded to indicate a count of 112 and a count of 128 for use by the counter synchronizing circuitry.

The counter synchronizing circuit 51 insures that if the up/down counter 43 gets out of synchronism with the actual buffer content for any reason, it will be resynchronized whenever the buffer 18 passes through a half-full condition. Since the loop is set to operate with the buffer 18 one-half full for the nominal input data rates, there need only be a slight amount of bit jitter to cause this required movement above and below half-full.

This synchronizing is accomplished by comparing the outputs of the buffer content flip-flop 48 to the decoded levels from the up/down counter 43. If the half-full circuit 41 shows the buffer 18 to be less than half-full and the up/down counter's 128 count output is set, indicating a greater than half-full condition, the synching logic 51 forces a "load 127" command to the counter. If the opposite condition occurs, that is the half-full circuit changes to greater than half-full and the counter 43 shows a count of less than 112, the synching circuit forces a "load 128" command to the counter. The 112 count is used instead of the 127 count to allow for the number of bytes which can be in the process of "rippling through" the FIFO registers 19, 21, 23, 25. In this manner, the counter 43 must be in sync with the buffer content to within 16 bytes, out of a total capacity of 256 bytes. An additional desirable function of the synching logic 51 is to force a 127 count when a "data present" indication is false. This function keeps the VCO 35 operating at its nominal frequency in the absence of data.

An eight bit monolithic analog to digital converter 46 is used to convert the binary output of the up/down counter 43 into a voltage proportional to the count. The output of the D/A converter 46 feeds the loop filter 47.

The loop filter 47 is a passive lag-lead-lag type network that controls the loop response. Its characteristics are chosen to optimize the jitter attenuation (loop frequency response). The jitter tolerance, and the loop stability, the output of this filter 47 controls the frequency of the VCO 35.

The VCO 35 converts the output of the loop filter 47 into a frequency proportional to the voltage. The output of the VCO 35 controls the Shift-Out commands for the buffer and the serial shift-out for the parallel/serial converter 27. The VCO output may be appropriately divided down as necessary to perform these clocking functions.

Figure 5:
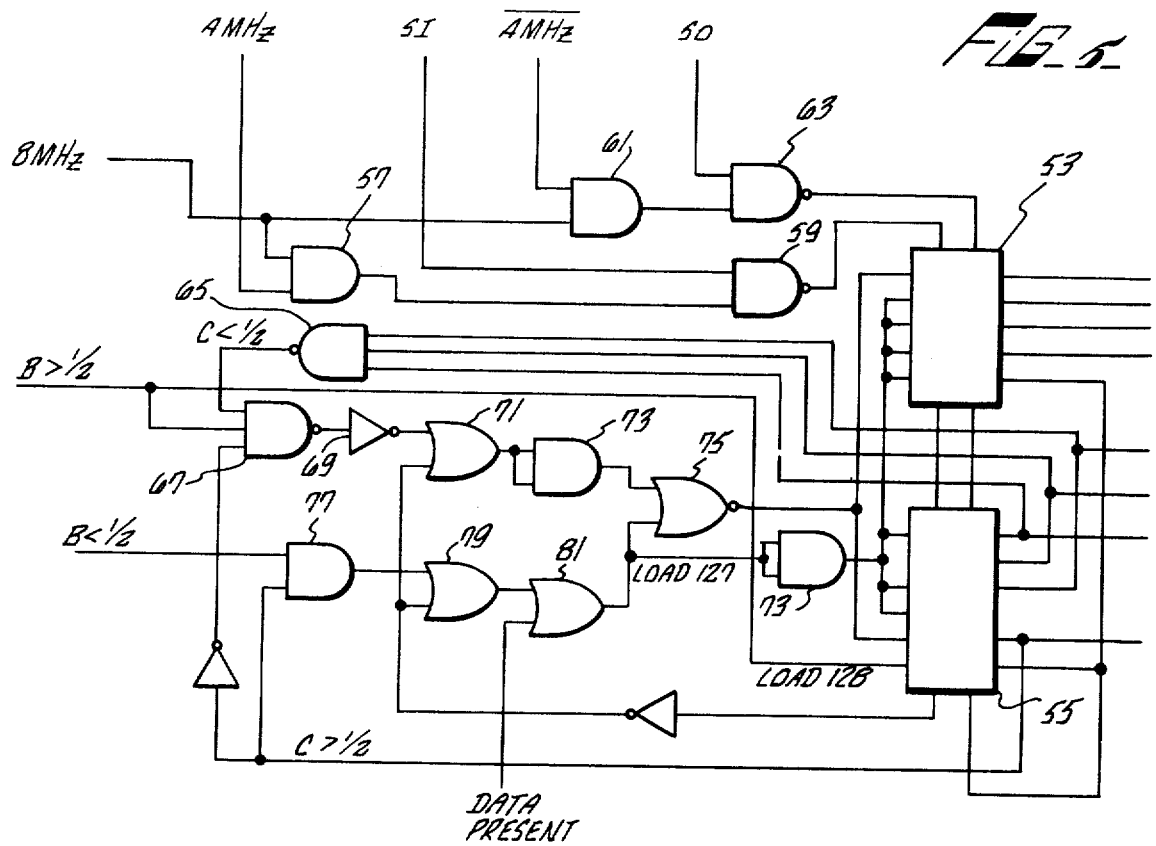
FIG. 5 illustrates synchronizing and anticoincidence logic employable in the preferred embodiment.

An exemplary implementation of the up/down counter 43, anticoincidence logic 44 and counter synchronizing logic 51 is illustrated in FIG. 5. The counter is constructed of two, four-bit up/down counter chips 53, 55. The anticoincidence logic 44 includes a first AND gate 57 supplied with the internal clocks. The first AND gate 57 supplies one input to a second NAND gate 59, whose other input is the shift-in clock signal SI. The second NAND gate 59 provides the up-count input to the up/down counter 53. A third AND gate 61 receives a first input from the eight megahertz clock signal and a second input from the inverted four megahertz clock signal. The third AND gate 61 outputs to a fourth NAND gate 63. This other input is supplied by the shift-out clock signal 50. The output of the fourth NAND gate 63 is the down-count indication supplied to the up/down counter 43.

The counter synchronizing logic 51 operates on a number of control signals. A count less than one-half indication $C < \frac{1}{2}$ is provided by supplying the 16, 32, and 64 output indications of the second counter chip 55 to a NAND gate 65. A count greater than one-half indication $C > \frac{1}{2}$ is provided by tapping the 128 output indication (8th bit) of the up/down counter 43. Additional control signals to the counter synchronizing circuit 51 include the buffer greater than one-half indication $B > \frac{1}{2}$, the buffer less than one-half indication $B < \frac{1}{2}$ and a data present indication.

These signals control load-enable, load 127 and load 128 indications to the up/down counter 43. The buffer greater than one-half signal is connected directly to the load 128 control line at the counter 43 and to one input of a three-input NAND gate 67. The other two inputs to the NAND gate 67 are the less than one-half signal and the inverted form of the count greater than one-half signal. The NAND gate outputs to an inverter 69, which feeds one input of an OR gate 71. The other input to the OR gate 71 is the carry output of the second counter chip 55. The OR gate 71 inputs to an AND gate 73 having its inputs connected in common. The AND gate 73 outputs to a NOR gate 75 which is connected to trigger the load-enable inputs of both counter chips 53, 55. The buffer less than one-half full and count greater than one-half signals are fed to an AND gate 77 which outputs to a second OR gate 79. The second input to the second OR gate 79 is from the carry output of the second counter chip. The second OR gate 79 outputs to a third OR gate 81 whose second input is the data present signal. The output of the third OR gate is connected to the NOR gate 75 and also supplies the load 127 command.

Figure 7:
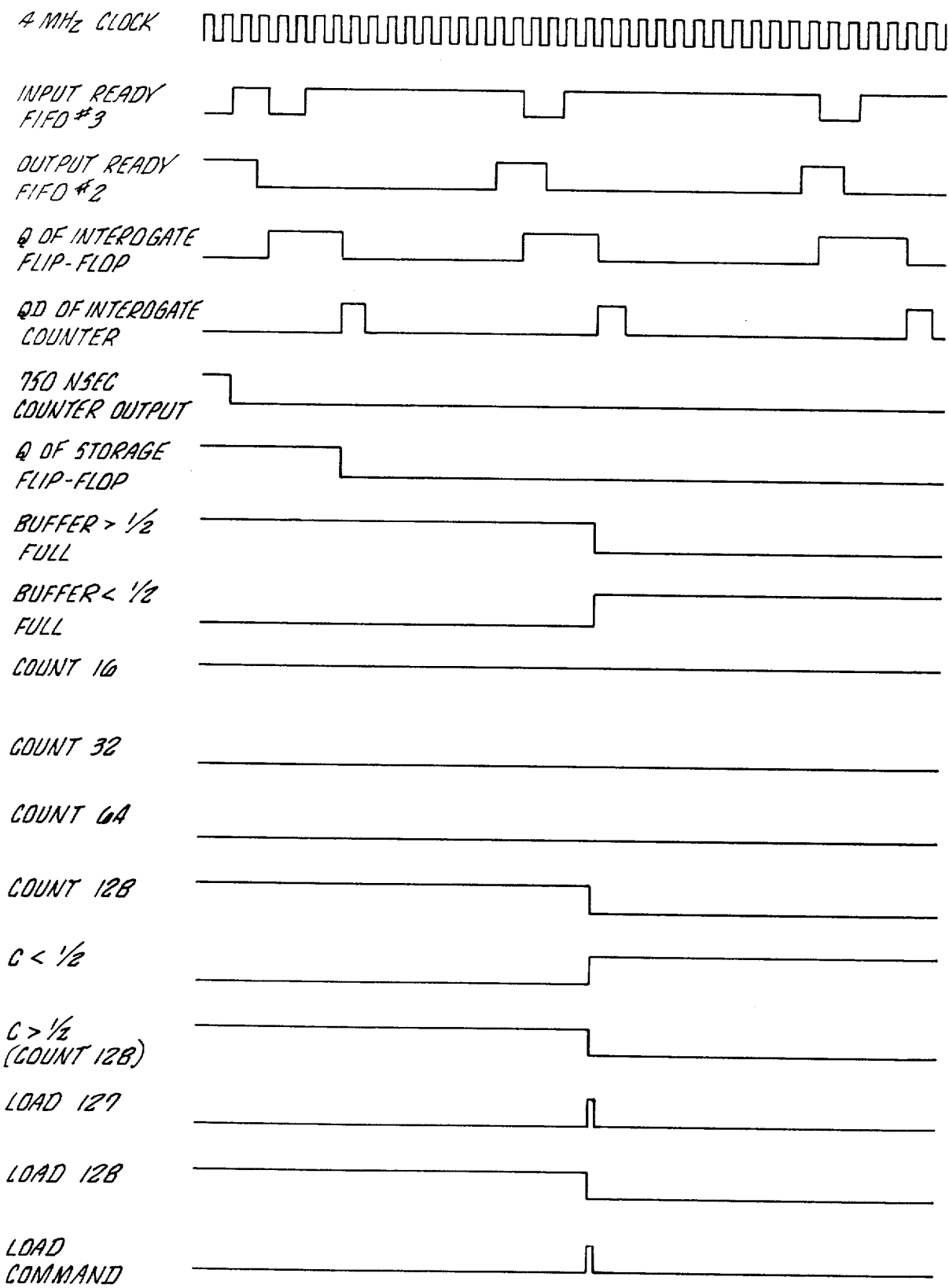

Thus, when a load-enable signal is supplied by the NOR gate 75, either or both of the load 127 and load 128 signals may be applied, as determined by the control signals to the logic, to enable setting the counter at 127, 128 or 255 as referred to previously. FIG. 6 illustrates waveforms at various points in the half-full circuitry 41 and the counter synchronizing logic 51 as the control of the buffer 18 changes from less than one-half full to greater than one-half full with the up/down counter 43 showing less than one-half full. FIG. 7 indicates these waveforms for the buffer content changing from greater than one-half full to less than one-half full, with the up/down counter 43 showing greater than one-half full.

Another approach to monitoring the buffer content and controlling the VCO is illustrated in FIG. 8. This approach uses a phase lock loop concept with a secondary control based on the content of the buffer 111. The buffer status is roughly monitored by clocking an up/down counter 115 with the clock which clocks data into the buffer 111. If bits are stored in parallel, the input clock is divided by the number of parallel bits. For example, a four bit divider 113 may be used with four bit FIFOs in the buffer 111. When the buffer is between $\frac{1}{4}$ and $\frac{3}{4}$ full, the VCO frequency is controlled by the output of a phase detector 114, which averages the incoming data rate. However, if the buffer content exceeds these limits, then the secondary control 117 forces the phase detector 114 into a full-off or full-on condition depending on whether the buffer content was less than $\frac{1}{4}$ or greater than $\frac{3}{4}$ respectively. Such conditions force the VCO 119 to slew down or up in frequency until the buffer content is back within the prescribed limits.

Such a technique is valid but has several drawbacks. First, the VCO control is not derived from the most critical parameter, the buffer content, but only uses that as a secondary control. Second, the secondary control input is a step function, making the loop transient response a critical factor. Finally, the loop response is non-linear because the secondary control is a step function and because the phase detector cannot stay in phase lock when the loop is attenuating the input flutter. This nonlinear nature makes the theoretical analysis and predictability of the loop response much more difficult to evaluate. Using the buffer content as the VCO control provides linear operation over the entire dynamic range and its operation is entirely predictable.

As should be apparent from the above discussion, many modifications and adaptations of the preferred embodiment may be made without departing from the scope and spirit of the invention. Therefore, it is to be understood that, within the scope of the appended claims, the invention may be practiced other than as specifically described herein.

What is claimed is:

1. Dejittering apparatus for data comprising:
a first-in, first-out buffer adapted to be clocked for receiving and outputting said data;
input clocking means for clocking data into said buffer;
output clocking means for clocking data out of said buffer;
means for counting the amount of data clocked into said buffer by said input clocking means and for reducing said count in accordance with the amount of data clocked out by said output clocking means;
half-full circuit means for developing a half-full signal indicating that said buffer is less than or greater than approximately half-full;
counter synchronizing logic means responsive to said half-full signal for synchronizing said counter to the actual content of said buffer;
means for converting the count of said counting means into a frequency control signal; and
means responsive to said frequency control signal for controlling the rate at which data is clocked out of said buffer by said output clocking means.

2. The apparatus of claim 1 wherein said buffer comprises a plurality of first-in, first-out registers.

3. The apparatus of claim 2 wherein said input clocking means comprises:
a serial to parallel converter; and
input sequencing means for clocking data into a first of said first-in, first-out registers from said serial to parallel converter.

4. The apparatus of claim 3 wherein said output clocking means comprises:
a parallel to serial converter; and
output sequencing means for clocking data from the last of said first-in, first-out registers into said parallel to serial converter.

5. The apparatus of claim 4 wherein said converting means comprises:
a digital to analog converter fed by said counter; and
filter means for producing said frequency control signal from the output of said digital to analog converter.

6. A dejittering apparatus for removing jitter from a stream of incoming data presented to said apparatus comprising:
buffer means for receiving and storing the incoming data;
means for clocking the data stored by said buffer means out of said buffer means;
determining means for determining whether the amount of data is outside a defined range and for adjusting the frequency of said clocking means when said amount of data is outside of said range; and
phase detector means responsive to said determining means for adjusting the frequency of said clocking means when said amount of data is within said defined range.

7. Dejittering apparatus for data comprising:
buffer means for storing said data in accordance with the rate of an input clock and for outputting said data in response to an output clock;
an adjustable frequency oscillator for supplying said output clock;
means for averaging the input clock rate to adjust the frequency of said oscillator;
means for monitoring said input clock to derive an indication of the amount of data in said buffer; and
means for causing said averaging means to adjust the oscillator frequency if said amount of data in said buffer departs from a defined range.

8. A dejittering apparatus for removing jitter from an incoming data stream presented to said apparatus comprising:
buffer means for receiving, storing and outputting the data on a first-in, first-out basis, said buffer means comprising a plurality of cascade-coupled storage registers;
input clocking means for providing an input clock for clocking the data into said buffer means;
output clocking means for providing an output clock for clocking the data out of said buffer means;
counting means for providing a count representative of the amount of data stored in said buffer means;
converting means for converting said count of said counting means into a frequency control signal; and
control means responsive to said frequency control signal for controlling the rate at which data is clocked out of said buffer means by said output clock.

9. The dejittering apparatus of claim 8 wherein said counting means is controlled by said input and output clocks.

10. The dejittering apparatus of claim 9 wherein said counting means is an up/down counter having an up count input coupled to said input clock and a down count input coupled to said output clock.

11. The dejittering apparatus of claim 10 further comprising:
half-full circuit means for generating a half-full signal indicating that said buffer means is less than or greater than approximately half-full of data;
counter synchronizing means responsive to said half-full signal for synchronizing said up/down counter to the actual content of said buffer means.

12. The dejittering apparatus of claim 11 further comprising means for causing said counting means to produce a count representative of a half-full buffer means when data is not present on the incoming data stream.

13. The dejittering apparatus of claim 12 wherein the data stream is a serial data stream and wherein said input clocking means comprise:
   a serial to parallel converter; and
   input sequencing means for clocking data into a first of said registers from said serial to parallel converter.

14. The dejittering apparatus of claim 13 wherein said output clocking means comprises:
   a parallel to serial converter; and
   output sequencing means for clocking data from the last of said registers into said parallel to serial converter.

15. The apparatus of claim 14 wherein said converter means comprises:
   a digital to analog converter fed by said counter; and
   filter means for producing said frequency control signal from the output of said digital to analog converter.

* * * * *

UNITED STATES PATENT AND TRADEMARK OFFICE
CERTIFICATE OF CORRECTION

PATENT NO. : 4,270,183
DATED : May 26, 1981
INVENTOR(S) : Robert L. Robinson, et al It is certified that error appears in the above—identified patent and that said Letters Patent is hereby corrected as shown below:

Column 4, line 39, delete "47" and insert -- 48 --.

Column 5, lines 44-45, delete ". The jitter tolerance, and the loop stability, the" and insert --, the jitter tolerance, and the loop stability. The --.

Title page, Assignee, delete "Lockheed Aircraft Corp." and insert -- Lockheed Electronics Company, Inc. --.

Signed and Sealed this

Twentieth Day of October 1981

[SEAL]

Attest:

GERALD J. MOSSINGHOFF

Attesting Officer    Commissioner of Patents and Trademarks